US008314544B2

(12) United States Patent
Ju

(10) Patent No.: US 8,314,544 B2
(45) Date of Patent: Nov. 20, 2012

(54) INORGANIC LIGHT-EMITTING DEVICE

(75) Inventor: Sang Hyun Ju, Gyeonggi-do (KR)

(73) Assignee: Kyonggi University Industry & Academia Cooperation Foundation, Gyeonggi-do (KR)

( * ) Notice: Subject to any disclaimer, the term of this patent is extended or adjusted under 35 U.S.C. 154(b) by 0 days.

(21) Appl. No.: 13/061,250

(22) PCT Filed: Sep. 1, 2009

(86) PCT No.: PCT/KR2009/004922
§ 371 (c)(1),
(2), (4) Date: Feb. 28, 2011

(87) PCT Pub. No.: WO2010/024652
PCT Pub. Date: Mar. 4, 2010

(65) Prior Publication Data

US 2011/0148286 A1 Jun. 23, 2011

(30) Foreign Application Priority Data

Sep. 1, 2008 (KR) ........................ 10-2008-0085647
Dec. 30, 2008 (KR) ........................ 10-2008-0136771

(51) Int. Cl.
*H01J 1/62* (2006.01)
*H01J 1/63* (2006.01)
*H01L 51/54* (2006.01)

(52) U.S. Cl. ........................................ 313/503; 313/506

(58) Field of Classification Search ........................ None
See application file for complete search history.

(56) References Cited

U.S. PATENT DOCUMENTS

2005/0208302 A1* 9/2005 Yi et al. ........................ 428/402
2008/0142823 A1* 6/2008 Moon et al. ...................... 257/98
2010/0078624 A1* 4/2010 Moon et al. ...................... 257/13
2011/0135827 A1* 6/2011 Kim et al. ...................... 427/310
2011/0149018 A1* 6/2011 Kroll et al. ...................... 348/40

FOREIGN PATENT DOCUMENTS

KR 10-0624419 B1 9/2006
KR 10-0691276 B1 3/2007
KR 10-2008-0055546 A 6/2008
KR 10-2008-0063225 A 7/2008
WO WO 2007/098451 A1 8/2007

OTHER PUBLICATIONS

International Search Report mailed Apr. 28, 2010 for PCT/KR2009/004922.

* cited by examiner

*Primary Examiner* — Ashok Patel
(74) *Attorney, Agent, or Firm* — Yoo & Associates

(57) ABSTRACT

The present invention relates to an inorganic light-emitting device, and more particularly, to an inorganic light emitting device having superior mechanical strength and a long lifespan, and which is capable of maintaining uniform and high efficiency of light emission, and has transparent and flexible characteristics. The inorganic light emitting device of the present invention includes a first electrode, a fluorescent layer formed on the first electrode, and which includes a plurality of nanowires made of inorganic light-emitting materials, and a second electrode formed on the fluorescent layer. The fluorescent layer is coated with the plurality of nanowires.

20 Claims, 8 Drawing Sheets

INORGANIC LIGHT-EMITTING DEVICE

This application claims the priority of Korean Patent Application No. 10-2008-0085647, filed on Sep. 1, 2008 and priority of Korean Patent Application No. 10-2008-0136771, filed on Dec. 30, 2008, in the KIPO (Korean Intellectual Property Office), the disclosure of which is incorporated herein entirely by reference. Further, this application is the National Stage application of International Application No. PCT/KR2009/004922, filed Sep. 1, 2009, which designates the United States and was published in Korean. Each of these applications is hereby incorporated by reference in their entirety into the present application.

TECHNICAL FIELD

Embodiments relate to inorganic light emitting devices that can be used for light emitting devices or backlights of flat panel display apparatuses.

BACKGROUND ART

A light emitting device includes a fluorescent layer formed between first and second electrodes, and the fluorescent layer is formed of a fluorescent material that includes an organic fluorescent material or an inorganic fluorescent material. When a voltage is applied between the first and second electrodes, the fluorescent material included in the fluorescent layer is excited, and thus the light emitting device emits visible light. The light emitting device is used as a light emitting diode of a flat panel display such as plasma display panel (PDP) or an organic light emitting diode (OLED), or a backlight of a liquid crystal display apparatus.

In a light emitting device that includes the fluorescent layer formed of an inorganic fluorescent material, the inorganic fluorescent material is in a dispersed powder state on a base such as a resin. The light emitting device has a high mechanical strength, a stable thermal stability, and a long lifetime. However, the light emitting device also has some limitations that it requires a high driving voltage, has low light emission brightness, and is difficult to realize a blue color. However, a light emitting device having a fluorescent layer formed of an organic fluorescent material has high light emission efficiency and a low driving voltage. However, it has low thermal stability and a short lifetime.

DISCLOSURE OF INVENTION

Technical Problem

An aspect of the present invention provides an inorganic light emitting device that has high mechanical strength and long lifetime, maintains overall uniform and high light emission efficiency, and has transparent and flexibility.

Technical Solution

According to at least one of embodiments, an inorganic light emitting device includes: a first electrode; a fluorescent layer that is formed on the first electrode and comprises a plurality of nanowires; and a second electrode formed on the fluorescent layer, wherein the fluorescent layer is formed by coating the nanowires. At this point, the fluorescent layer may be formed by coating a polar solvent in which the nanowires are dispersed using a field effect dispersion method, a random dispersion method, or an alignment method, in which an electric field is applied to the polar solvent after dropping the polar solvent.

The fluorescent layer may be formed by coating a nano-mixture made by mixing the nanowires and an organic material. At this point, the nano-mixture may be coated by using a method selected from the group consisting of a spin coating method, an ink-jet method, a laser transfer method, a nano-implantation method, and a silk screen printing method. Also, the organic material may be removed in a subsequent heating process after being coated. Also, the organic material may include one selected from the group consisting of a conductive polymer resin, a silicon resin, a polyimide resin, an urea resin, and an acryl resin, an optically transparent epoxy resin, and an optically transparent silicon resin. Also, the organic material may further include a light emission activator or a nanowire dispersant.

The nanowires may be arranged in a horizontal direction or a vertical direction with respect to an upper surface of the first electrode, or in irregular directions between the first electrode and the second electrode. Also, the nanowires may be formed to have a length smaller than a distance between the first electrode and the second electrode, and may form a random network by being randomly arranged and connected to each other in the fluorescent layer.

The inorganic light emitting device may further include at least one of a first insulating layer formed between the first electrode and the fluorescent layer and a second insulating layer formed between the second electrode and the fluorescent layer, wherein the first and second insulating layers are formed of an organic material, an inorganic material, or a composite of the organic and inorganic materials.

Also, according to another embodiment, an inorganic light emitting device includes: an insulating substrate; a first electrode formed in a bar shape on a side of an upper surface of the insulating substrate; a second electrode separated from the first electrode on the other side of the upper surface of the insulating substrate; and a fluorescent layer formed between the first electrode and the second electrode and comprises a plurality of nanowires formed of an inorganic light emitting material, wherein the fluorescent layer is formed by coating the nanowires. At this point, the fluorescent layer may be formed by coating a polar solvent in which the nanowires are dispersed using a field effect dispersion method, a random dispersion method, or an alignment method, in which an electric field is applied to the polar solvent after dropping the polar solvent.

Also, the fluorescent layer may be formed by coating a nano-mixture made by mixing the nanowires and an organic material. At this point, the nano-mixture may be coated by using a method selected from the group consisting of a spin coating method, an ink-jet method, a laser transfer method, a nano-implantation method, and a silk screen printing method. Also, the organic material may be removed in a subsequent heating process after being coated. Also, the organic material may include one selected from the group consisting of a conductive polymer resin, a silicon resin, a polyimide resin, an urea resin, and an acryl resin, an optically transparent epoxy resin, and an optically transparent silicon resin. Also, the organic material may further include a light emission activator or a nanowire dispersant. The nanowires may be arranged in a horizontal direction or a vertical direction with respect to an upper surface of the first electrode, or in irregular directions between the first electrode and the second electrode. Also, the nanowires may be formed to have a length smaller than a distance between the first electrode and the second electrode, and may form a random network by randomly arranged and connected to each other in the fluorescent layer.

The inorganic light emitting device may further include at least one of a first insulating layer formed between the first electrode and the fluorescent layer and a second insulating layer formed between the second electrode and the fluorescent layer, wherein the first and second insulating layers are formed of an organic material, an inorganic material, or a composite of the organic and inorganic materials.

The inorganic light emitting material that is used as a red fluorescent substance may include one material selected from the group consisting of CaS:Eu(host:dopant), ZnS:Sm, ZnS:Mn, $Y_2O_2S$:Eu, $Y_2O_2S$:Eu,Bi, $Gd_2O_3$:Eu, (Sr,Ca,Ba,Mg)$P_2O_7$:Eu,Mn, $CaLa_2S_4$:Ce, $SrY_2S_4$:Eu, (Ca,Sr)S:Eu, SrS:Eu, $Y_2O_3$:Eu, and $YVO_4$:Eu,B, a green fluorescent substance may include one material selected from the group consisting of ZnS:Tb(Host:dopant), ZnS:Ce,Cl, ZnS:Eu, ZnS:Cu,Al, $Gd_{2O2S}$:Tb, $Gd_{2O3:}$Tb,Zn, $Y_{2O3:}$ Tb,Zn, $SrGa_{2S4:}$Eu, $Y_2SiO_{5:}$ Tb, $Y_{2S}i_{2O7:}$Tb, $Y_{2O2S}$:Tb, ZnO:Ag, ZnO:Cu,Ga, CdS:Mn, $BaMgAl_{10O17:}$Eu,Mn, (Sr,Ca,Ba)$(Al,Ga)_{2S4:}$Eu, $Ca_{8M}g$ $(SiO_{4)}4Cl_{2:}$:Eu,Mn, $YBO_{3:}$Ce,Tb, $Ba_2SiO_{4:}$Eu, $(Ba,Sr)_2SiO_{4:}$Eu, $Ba_2(Mg,Zn)Si_{2O7:}$Eu, $(Ba,Sr)Al_{2O4:}$Eu, and $Sr_{2S}i_{3O8}2SrCl_{2:}$Eu, and a blue fluorescent substance may include one material selected from the group consisting of GaN:Mg,Si(Host:dopant), GaN:Zn,Si, SrS:Ce, SrS:Cu, ZnS:Tm, ZnS:Ag,Cl, ZnS:Te, $Zn_2SiO_4$:Mn, $YSiO_5$:Ce, $(Sr,Mg,Ca)_{10}(PO_4)6Cl_2$:Eu, $BaMgAl_{10}O_{17}$:Eu, $BaMg_2Al_{16}O_{27}$:Eu.

Advantageous Effects

In the inorganic light emitting device according to the present invention, the fluorescent layer is uniformly formed by coating nanowires formed of an inorganic light emitting material or the nanowires together with an organic material, high and overall uniform light emission efficiency can be maintained.

Also, the fluorescent layer of the inorganic light emitting device is formed of nanowires formed of an inorganic light emitting material, and thus the inorganic light emitting device can realize high mechanical strength and long lifetime and can maintain overall uniform and high light emission efficiency.

Also, the fluorescent layer of the inorganic light emitting device is formed of nanowires, and thus when the inorganic light emitting device is driven by a low voltage, electrons are overall uniformly excited in the fluorescent layer, thereby realizing high light emission brightness.

Also, since the fluorescent layer of the inorganic light emitting device is formed of nanowires unlike in a conventional fluorescent layer that is formed as a flat panel type thin film, the fluorescent layer has transparency and physical flexibility. Thus, the fluorescent layer can be used as a light emitting device or a backlight of a flat panel display apparatus.

BEST MODE FOR CARRYING OUT THE INVENTION

Inorganic light emitting devices according to embodiments of the present invention win now be described more fully hereinafter with reference to the accompanying drawings.

First, an inorganic light emitting device according to an embodiment of the present invention will be described.

Figure 1:
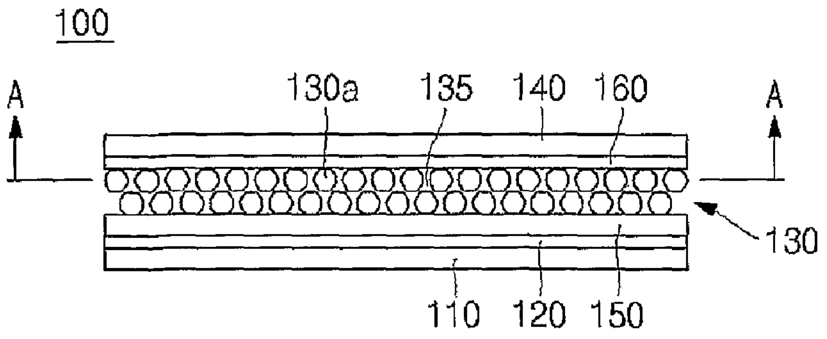
FIG. 1 is a schematic vertical cross-sectional view of an inorganic light emitting device according to an embodiment of the present invention.
Figure 2:
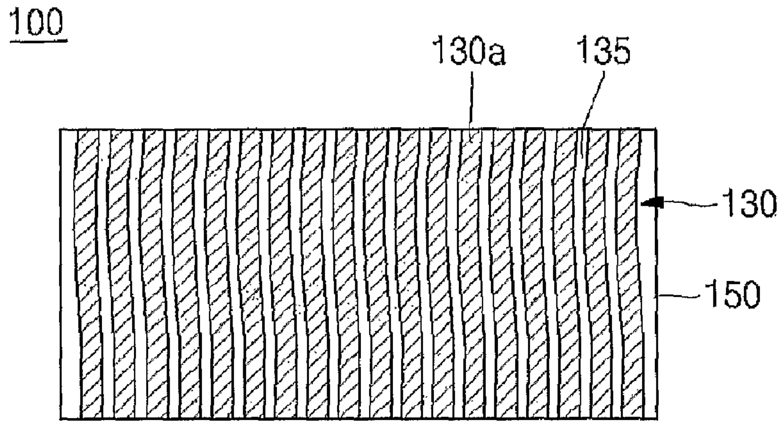
FIG. 2 is a schematic plan view taken along a line A-A of FIG. 1.

FIG. 1 is a schematic vertical cross-sectional view of an inorganic light emitting device 100 according to an embodiment of the present invention. FIG. 2 is a schematic plan view taken along a line A-A of FIG. 1.

Referring to FIGS. 1 and 2, the inorganic light emitting device 100 according to an embodiment of the present invention may include a first electrode 120, a fluorescent layer 130, and a second electrode 140. Also, the inorganic light emitting device 100 may further include a substrate 110 formed on a lower surface of the first electrode 120. Also, the inorganic light emitting device 100 may further include a first insulating layer 150 formed between the first electrode 120 and the fluorescent layer 130 and a second insulating layer 160 formed between the fluorescent layer 130 and the second electrode 140. Meanwhile, the inorganic light emitting device 100 may include one of the first and second insulating layers 150 and 160 or both of them.

In the inorganic light emitting device 100, the fluorescent layer 130 is formed by coating nanowires formed of an inorganic light emitting material or by coating the nanowires together with an organic material. Thus, as a whole, a uniform fluorescent layer may be readily formed.

The inorganic light emitting device 100 forms a single pixel which is a basic unit that displays an image in a fiat panel display apparatus. Also, the inorganic light emitting device 100 may be formed in a red, a green, or a blue pixel according to the kind of coated fluorescent material. Accordingly, a plurality of the inorganic light emitting devices 100 may be used as light emitting devices that constitute a unit pixel of a flat panel display apparatus. Also, the fluorescent layer 130 of the inorganic light emitting device 100 is flexible since the fluorescent layer 130 is formed of nanowires, and thus the inorganic light emitting device 100 may be used in a flexible flat panel display apparatus. Also, the fluorescent layer 130 of the inorganic light emitting device 100 is relatively transparent since it is formed of nanowires, and thus the inorganic light emitting device 100 may also be used in a transparent flat panel display apparatus. Also, the inorganic light emitting device 100 may be used as a backlight of a fiat panel display apparatus, in particular, a liquid crystal display apparatus.

Hereinafter, a single inorganic light emitting device 100 will mainly be described. The description of the inorganic light emitting device 100 may be expanded to various flat panel display apparatus formed of a plurality of inorganic light emitting devices. For example, the substrate 110 is depicted as a size corresponding to a single inorganic light emitting device 100. However, the substrate 110 may be formed to a size corresponding to a total size of the flat panel display apparatus. Also, the number of the first and second electrodes 120 and 140 is formed to correspond to the number of the inorganic light emitting devices 100 that constitute the flat panel display apparatus. Thus, the first and second electrodes 120 and 140 may be entirely arranged on the substrate 110 by being electrically insulated from each other. Also, the first and second electrodes 120 and 140 formed on both sides of the substrate 110 may be formed in a stripe shape or a lattice shape facing each other overall with respect to the respective fluorescent layer 130 on the entire substrate 110 of the flat panel display apparatus.

The substrate 110 may be a ceramic substrate, a silicon substrate, a glass substrate, or a polymer substrate. In particular, when the inorganic light emitting device 100 is used in a transparent display apparatus, the substrate 110 may be formed of glass or transparent plastic. The glass substrate may be formed of a silicon oxide. Also, the polymer substrate may be formed of a polymer material selected from the group consisting of polyethylene terephthalate (PET), polyethylene naphthalate (PET), and polyimide. Also, a thin film transistor, a semiconductor layer, or an insulating layer may be formed or the substrate 110 according to the structure of a flat panel display apparatus that uses the inorganic light emitting device 100.

The first electrode 120 may be formed as a thin film on an upper surface of the substrate 110, and may function as a cathode or an anode. The first electrode 120 may be a metal layer formed of a metal selected from the group consisting of aluminum Al aluminum:neodium Al:Nd, silver Ag, tin Sn, tungsten W, gold Au, chrome Cr, molybdenum Mo, palladium Pd, platinum Pt, nickel Ni, and titanium Ti. Also, the first electrode 120 may be a transparent layer formed of a transparent conductive material selected from the group consisting of indium tin oxide (ITO), indium zinc oxide (IZO), F-doped tin oxide (FTO), zinc oxide), Ca:ITO, and Ag:ITO. In particular, when the first electrode 120 is formed on a surface on which an image of the inorganic light emitting device 100 is displayed, the first electrode 120 may be formed as a transparent layer.

When the first electrode 120 is formed of a transparent conductive layer, the first electrode 120 may additionally include a bus electrode (not shown) that is formed of a metal layer, has a width relatively smaller than that of the transparent conductive layer, and is formed parallel to the transparent conductive layer in contact with the transparent conductive layer. The bus electrode compensates for the low electrical conductivity of the transparent conductive layer, and thus increases driving efficiency of the inorganic light emitting device 100.

Also the first electrode 120 may further include a conduction layer (not shown) formed of a conductive polymer on a surface of the first electrode 120 facing the fluorescent layer 130. The conduction layer may be formed of a polymer selected from the group consisting of polypyrrole, polyaniline, poly(3,4-ethylenedioxythiophene), polyacetylene, poly(p-phenylene), polythiophene, poly(p-phenylene vinylene), and poly(thienylene-vinylene). The conduction layer may increase electrical combination between the first electrode 120 and the fluorescent layer 130.

The fluorescent layer 130 is formed by coating a plurality of nanowires formed of an inorganic light emitting material on the upper surface of the first electrode 120. When the inorganic light emitting device 100 is driven as the same driving method as an organic light emitting device (OLED), the fluorescent layer 130 is directly coated on the upper surface of the first electrode 120 and is electrically connected to the first electrode 120. In particular, when the fluorescent layer 130 is driven by being electrically connected to the first electrode 120, the fluorescent layer 130 may be driven by a low voltage direct current.

Meanwhile, when the first insulating layer 150 is formed on an upper surface of the substrate 110, the fluorescent layer 130 may be formed by coating on an upper surface of the first insulating layer 150. According to the driving method of the inorganic light emitting device 100, the fluorescent layer 130 may be formed on the upper surface of the first insulating layer 150, and may be electrically insulated from the first electrode 120. For example, when the inorganic light emitting device 100 is driven by a method different from the OLED, the fluorescent layer 130 may be formed to be electrically insulated from the first electrode 120.

A planarizing layer 135 that includes spaces formed between the nanowires 130*a* may be formed in the fluorescent layer 130.

The fluorescent layer 130 may be formed by dispersing the nanowires 130*a*. The fluorescent layer 130 may have a thickness in a range from about 1 nm to about 500 nm. If the fluorescent layer 130 has a too small thickness, a color realization is difficult. However, if the fluorescent layer 130 has an excessive larger thickness, an unnecessary amount of nanowires 13*a* may be used. The thickness of the fluorescent layer 130 may be controlled according to the density of the nanowires 130*a*.

The fluorescent layer 130 may be formed by using a field effect dispersion method in which an electric field is applied to a polar solution in which the nanowires are dispersed after dropping the polar solution on the first electrode, a random dispersion method in which the polar solvent is dispersed, an alignment method, or a dispersion method in which the nanowires 130*a* are dispersed by combining with a layer formed thereunder. The fluorescent layer 130 may be formed such that, after directly depositing the nanowires 130*a* overall randomly or in rows on the first electrode 120, unnecessary portions are removed to remain a necessary portion. Also, the fluorescent layer 130 may be formed by depositing the nanowires 130*a* randomly or in rows on the first electrode 120 only on the necessary portion.

In the electric field dispersion method, after the nanowires 130*a* are dispersed in a polar solvent such as water, isopropyl alcohol, ethanol, acetone, or an exclusive nanowire dispersion solution, the fluorescent layer 130 is formed by dropping the nanowire dispersed solution on the first electrode 120. Afterwards, an electric field is applied to the fluorescent layer 130 so that the nanowires 130*a* can be arranged in a direction of the electric field in the polar solvent. Accordingly, the electric field dispersion method may form the fluorescent layer 130 having the nanowires 130*a* arranged in a uniform direction. The polar solvent may be evaporated after the nanowires 130*a* are dispersed, and the nanowires 130*a* in the fluorescent layer 130 are arranged overall in a uniform direction.

In the random dispersion method, after mixing the nanowires 130*a* with a polar solvent, the mixed solution is dropped on the first electrode 120. Afterwards, the fluorescent layer 130 is formed by evaporating the polar solvent. The random dispersion method may control the density of the nanowires 130*a* of the fluorescent layer 130 by repeating the above process. Also, in the random dispersion method, the substrate 110 is tilted in a predetermined direction with an angle, the nanowire dispersed polar solution is continuously dropped on the substrate in a length direction of the substrate, and the solution is dried are repeated. In order to arrange the nanowires 130*a* in a predetermined direction in the fluorescent layer 130, the above processes are repeatedly performed.

Also, the fluorescent layer 130 may be formed such that, after arranging the nanowires 130*a* on a separated substrate, the arranged nanowires 130*a* are transferred onto a desired region of the first electrode 120.

Also, the fluorescent layer 130 may be formed by coating an ink-type nano-mixture that has viscosity and is formed by mixing the nanowires 130*a* and an organic material as a dispersant. The organic material may be one selected from the group consisting of a conductive polymer resin, a silicon resin, a polyimide resin, an urea resin, and an acryl resin, and in particular, an optically transparent epoxy resin or an optically transparent silicon resin. Also, the organic material may include an additive such as a surfactant or a leveling agent, a co-solvent, or a liquid carrier vehicle to meet required physical properties of the ink. Also, the organic material may include a light emission activator or a nanowire dispersant. Here, the light emission activator denotes an organic material that can increase light emission characteristics of nanowires that have a fluorescent characteristic, that is, can facilitate the control of wavelength and intensity of light emission.

The organic material in the fluorescent layer 130 may be partly of entirely removed by being heat-dried or naturally dried after coating the nano-mixture. Accordingly, the fluorescent layer 130 may be formed of only nanowires 130*a* or a composite material layer with an organic material.

When the fluorescent layer 130 is formed by coating a nano-mixture in which nanowires and an organic material is mixed, the fluorescent layer 130 may be formed by using a spin coating method, an ink-jet method, a laser induced thermal imaging (LITI) method, a nano-implantation method, or a silk screen printing method. The spin coating method, the ink-jet method, the laser induced thermal imaging (LITI) method, the nano-implantation method, and the silk screen printing method are well known in the art, and thus the description there of will be omitted.

The nanowires 130*a* may be formed to have a length or width corresponding to that of the inorganic light emitting device 100. That is, the nanowires 130*a* may be formed to have a length or width corresponding to that of the first electrode 120 of the inorganic light emitting device 100. The nanowires 130*a* may be disposed to cross the length direction or the width direction of the first electrode 120. Also, the nanowires 130*a* may be disposed parallel to the upper surface of the first electrode 120. That is, the nanowires 130*a* may be formed to cross the upper surface of the first electrode 120 from a side to the other side of the first electrode 120. Also, the nanowires 130*a* may be disposed parallel to each other on the upper surface of the substrate 110. Also, the nanowires 130*a* may be formed a single layer or a multiple layer. When the nanowires 130*a* are formed as a multiple layer, the fluorescent layer 130 may be formed by coating the nanowires 130*a* several times.

Accordingly, since the fluorescent layer 130 is formed by a coating the nanowires 130*a* using a coating method, the fluorescent layer 130 may be readily and uniformly formed in overall. Also, since the fluorescent layer 130 is formed of nanowires, the fluorescent layer 130 has a high mechanical strength and along lifetime. Also, the fluorescent layer 130 maintains at high and uniform light emission efficiency with a low driving voltage. That is, since the fluorescent layer 130 is formed of the nanowires 130*a*, the inorganic light emitting device 100 may emits light at a low driving voltage. Accordingly, the inorganic light emitting device 100 can be able to be driven at a low driving voltage and has light emission efficiency higher than that of a conventional inorganic light emitting device. Also, since the inorganic light emitting device 100 has high light emission efficiency, the inorganic light emitting device 100 can readily realize a blue color.

The nanowires 130*a* may be formed in a shape in which a length is longer than a diameter, and the diameter may be in a range from about 1 nm to about 300 nm. If the diameter of the nanowires 130*a* is too small, the strength of the nanowires 130*a* is reduced, and thus the nanowires 130*a* may be easily broken, thereby reducing light emission efficiency. Also, if the diameter of the nanowires 130*a* is too large, the fluorescent layer 130 may not be uniformly formed.

The nanowires 130*a* may be formed of an inorganic light emitting material. The inorganic light emitting material may be various inorganic fluorescent materials according to color. For example, the inorganic light emitting material that is used as a red fluorescent substance may be CaS:Eu(host:dopant), ZnS:Sm, ZnS:Mn, $Y_2O_2S$:Eu, $Y_2O_2S$:Eu,Bi, $Gd_2O_3$:Eu, (Sr, Ca,Ba,Mg)$P_2O_7$:Eu,Mn, $CaLa_2S_4$:Ce, $SrY_2S_4$:Eu, (Ca,Sr)S: Eu, SrS:Eu, $Y_2O_3$:Eu, and $YVO_4$:Eu,B. also, the inorganic light emitting material that can be used as a green fluorescent substance may be ZnS:Tb(Host:dopant), ZnS:Ce,Cl, ZnS:Eu, ZnS:Cu,Al, $Gd_2O_2S$:Tb, $Gd_2O_3$:Tb,Zn, $Y_2O_3$:Tb,Zn, $SrGa_2S_4$:Eu, $Y_2SiO_5$:Tb, $Y_2SiO_7$:Tb, $Y_2O_2S$:Tb, ZnO:Ag, ZnO:Cu,Ga, CdS:Mn, $BaMgAl_{10}O_{17}$:Eu,Mn, (Sr,Ca,Ba)(Al, Ga)$_2S_4$:Eu, $Ca_8Mg(SiO_4)4Cl_2$:Eu,Mn, $YBO_3$:Ce,Tb, $Ba_2SiO_4$:Eu, (Ba,Sr)$_2SiO_4$:Eu, $Ba_2$(Mg,Zn)$Si_2O_7$:Eu, (Ba, Sr)$Al_2O_4$:Eu, and $Sr_2Si_3O_8.2SrCl_2$:Eu. Also, the inorganic light emitting material that can be used as a blue fluorescent substance may be GaN:Mg,Si(Host:dopant), GaN:Zn,Si, SrS:Ce, SrS:Cu, ZnS:Tm, ZnS:Ag,Cl, ZnS:Te, $Zn_2SiO_4$:Mn, $YSiO_5$:Ce, (Sr,Mg,Ca)$_{10}(PO_4)6Cl_2$:Eu, $BaMgAl_{10}O_{17}$:Eu, $BaMg_2Al_{16}O_{27}$:Eu, Also, the inorganic light emitting material that can be used as a white fluorescent substance may be Yttrium, Aluminum Garnet (YAG). The inorganic light emitting material may be an inorganic compound light emitting material that is expressed as $Ca_xSr_{x-1}Al_2O_3:Eu^{+2}$ that is synthesized from $CaAl_2O_3$ and $SrAl_2O_3$.

The planarizing layer 135 fills spaces between the nanowires 130*a* to planarize overall the fluorescent layer 130. The planarizing layer 135 is formed as a transparent layer so as to prevent the light emission efficiency of the nanowires 130*a* from reducing. The planarizing layer 135 may be formed of an oxide such as silicon oxide, a silicon resin, a polyimide resin, a urea resin, or an acryl resin, and in particular, may be an optically transparent epoxy resin or an optically transparent silicon resin. The planarizing layer 135 may not be formed when an organic material is included in the fluorescent layer 130 because the fluorescent layer 130 is formed of the nanowires 130*a* and the organic material.

The second electrode 140 is formed as a thin film and may function as a cathode or an anode. The second electrode 140 faces the first electrode 120 with respect to the fluorescent layer 130. That is, when the fluorescent layer 130 is formed on the upper surface of the first electrode 120, the second electrode 140 may be formed on an upper surface of the fluorescent layer 130. Also, when the fluorescent layer 130 is formed on the upper surface of the first insulating layer 150, the second electrode 140 may be formed on an upper surface of the second insulating layer 160. Although the first insulating layer 150 is formed, the second electrode 140 may be directly formed on the upper surface of the fluorescent layer 130 according to the driving method of the inorganic light emitting device. Also, the second electrode 140 may be formed to have a polarity opposite to that of the first electrode 120. The second electrode 140 may be a metal layer formed of a metal selected from the group consisting of Al, Al:Nd, Ag, Sn, W, Au, Cr, Mo, Pd, Pt, Ni, and Ti. Also, the second electrode 140 may be a transparent layer formed of a transparent conductive material selected from the group consisting of indium tin oxide (ITO), indium zinc oxide (IZO), F-doped tin oxide (FTO), zinc oxide), Ca:ITO, and Ag:ITO. When the first electrode 120 is formed as a metal layer, the second electrode 140 is formed as a transparent layer. When the first electrode 120 is formed as a transparent layer, the second electrode 140 may be formed as a metal layer, and may be a reflection layer that reflects light.

Also, the second electrode 140 may further include a conduction layer (not shown) formed of a conductive polymer on a surface of the second electrode 140 facing the fluorescent layer 130. The conduction layer may be formed of a polymer selected from the group consisting of polypyrrole, polyaniline, poly(3,4-ethylenedioxythiophene), polyacetylene, poly (p-phenylene), polythiophene, poly(p-phenylene vinylene), and poly(thienylene-vinylene). The conduction layer may increase electrical combination between the second electrode 140 and the fluorescent layer 130.

The first insulating layer 150 may be formed as a thin film between the first electrode 120 and the fluorescent layer 130. The first insulating layer 150 is optionally formed according to the driving method of the inorganic light emitting device 100. The first insulating layer 150 may be formed of an inorganic material, an organic material, or a composite of the organic and inorganic materials. More specifically, the inorganic material that can be used for forming the first insulating layer 150 may be a silicon nitride film such as silicon nitride, a silicon oxide, an oxide group insulator, or an organic insulator. The organic material that can be used for forming the first insulating layer 150 may be a polymer material such as PET, PEN, or polyimide. When the first electrode 120 is formed in a pixel display direction, the first insulating layer 150 is formed of a transparent material.

The second insulating layer 160 may be formed as a thin film between the second electrode 140 and the fluorescent layer 130. The second insulating layer 160 is optionally formed according to the driving method of the inorganic light emitting device 100. The second insulating layer 160 may electrically insulate the second electrode 140 from the fluorescent layer 130. The second insulating layer 160 may be formed of the same material used to form the first insulating layer 150. When the second electrode 140 is formed in a pixel display direction, the second insulating layer 160 is formed of a transparent material.

An inorganic light emitting device 200 according to another embodiment of the present invention will now be described.

Figure 3:
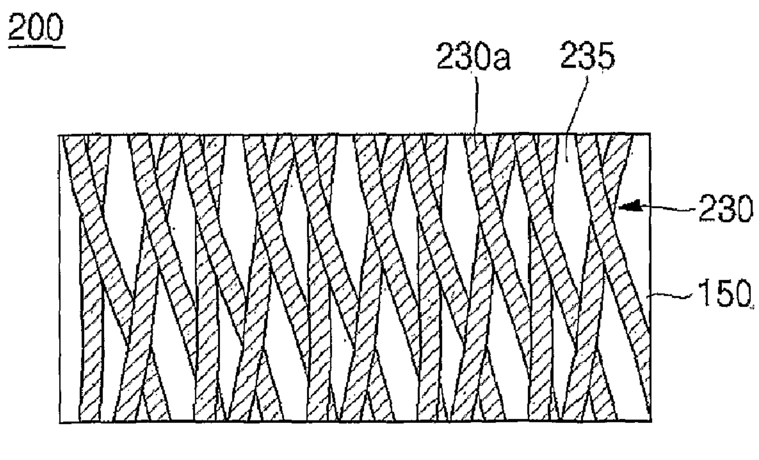
FIG. 3 is a schematic plan view of an inorganic light emitting device corresponding to the plan view of the inorganic light emitting device of FIG. 2, according to another embodiment of the present invention.

FIG. 3 is a schematic plan view of the inorganic light emitting device 200 corresponding to the plan view of the inorganic light emitting device of FIG. 2, according to another embodiment of the present invention.

Referring to FIG. 3, the inorganic light emitting device 200 according to another embodiment of the present invention may include a first electrode 120, a fluorescent layer 230, and a second electrode 140. Also, the inorganic light emitting device 200 may further include a substrate 110 formed on a lower surface of the first electrode 120, a first insulating layer 150 formed between the first electrode 120 and the fluorescent layer 230, and a second insulating layer 160 formed between the second electrode 140 and the fluorescent layer 230. Meanwhile, the inorganic light emitting device 200 may include one of the first and second insulating layers 150 and 160 or both of them.

The inorganic light emitting device 200 has the same or similar structure as that of the inorganic light emitting device 100 described with reference to FIGS. 1 and 2 except for the structure of the fluorescent layer 230. Accordingly, hereinafter, the fluorescent layer 230 of the inorganic light emitting device 200 is mainly described. Also, like reference numerals are used to indicate elements that are substantially identical or similar to the elements of FIGS. 1 and 2, and thus the detailed description thereof will not be repeated.

The fluorescent layer 230 may be formed as a thin film by coating a plurality of nanowires 230*a* using a coating method. Also, the nanowires 230*a* may be formed of an inorganic light emitting material which is described above, and thus the description thereof will not be repeated.

The nanowires 230*a* may be formed to have a length or width corresponding to that of the inorganic light emitting device 200. That is, the nanowires 230*a* may be formed to have a length or width corresponding to that of the first electrode 120 of the inorganic light emitting device 200. Also, the nanowires 230*a* may be disposed parallel to the upper surface of the first electrode 120. That is, the nanowires 230*a* may be formed to cross from a side to the other side of the first electrode 120 along the upper surface of the first electrode 120. At this point, the nanowires 230*a* may be arranged from a side to the other side of the first electrode 120 with a cross-legged shape. Furthermore, the nanowires 230*a* may be arranged parallel to the upper surface of the first electrode 120 with irregular directions on the first electrode 120. The fluorescent layer 230 may be relatively readily formed when compared to a case that the nanowires 230*a* are formed parallel to each other. In particular, when the nanowires 230*a* are formed as multiple layers, it is unnecessary for the nanowires 230*a* in different layers to form parallel to each other. Also, since the strength of the fluorescent layer 230 is increased by arranging the nanowires 230*a* in a cross-legged shape, although a pressure is applied to the fluorescent layer 230 in a direction perpendicular to the surfaces of the nanowires 230*a* and the first electrode 120, the bending of the inorganic light emitting device 200 may be prevented.

Also, a planarizing layer 235 that includes spaces formed between the nanowires 230*a* may be formed in the fluorescent layer 230.

An inorganic light emitting device 300 according to another embodiment of the present invention will now be described.

Figure 4:
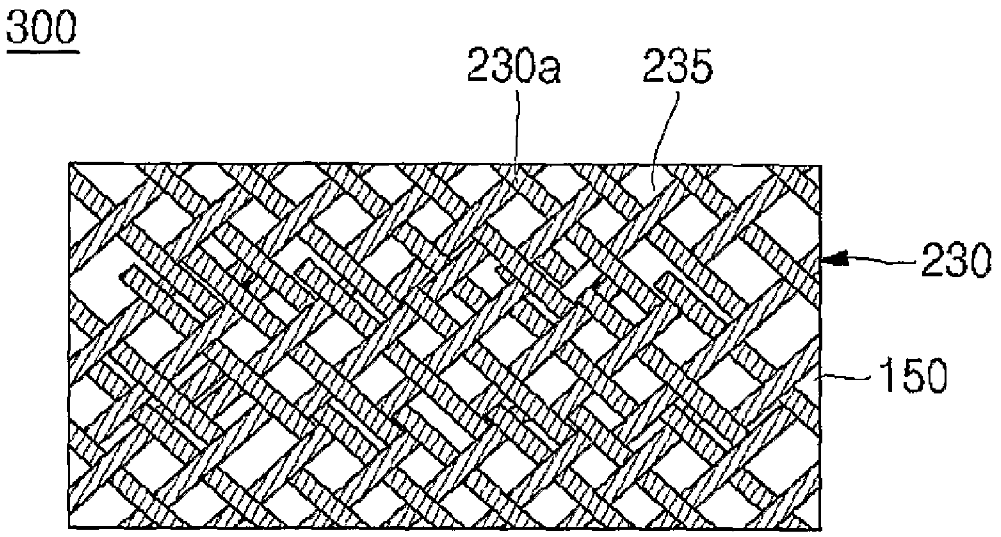
FIG. 4 is a schematic plan view of an inorganic light emitting device corresponding to the plan view of the inorganic light emitting device of FIG. 2, according to another embodiment of the present invention.

FIG. 4 is a schematic plan view of the inorganic light emitting device 300 corresponding to the plan view of the inorganic light emitting device of FIG. 2, according to another embodiment of the present invention.

Referring to FIG. 4, the inorganic light emitting device 300 according to another embodiment of the present invention may include a first electrode 120, a fluorescent layer 330, and a second electrode 140. The inorganic light emitting device 300 may further include a substrate 110 formed on a lower surface of the first electrode 120, a first insulating layer 150 formed between the first electrode 120 and the fluorescent layer 330, and a second insulating layer 160 formed between the second electrode 140 and the fluorescent layer 330. Meanwhile, the inorganic light emitting device 300 may include one of the first insulating layer 150 and the second insulating layer 160 or both of them.

The inorganic light emitting device 300 has the same or similar structure as that of the inorganic light emitting device 100 described with reference to FIGS. 1 and 2 except for the structure of the fluorescent layer 330. Accordingly, hereinafter, the fluorescent layer 330 of the inorganic light emitting device 300 is mainly described. Also, like reference numerals are used to indicate elements that are substantially identical or similar to the elements of FIGS. 1 and 2, and thus the detailed description thereof will not be repeated.

The fluorescent layer 330 may be formed as a thin all by coating a plurality of nanowires 330*a* using a coating method. Also, the nanowires 330*a* may be formed of an inorganic light emitting material.

The nanowires 330*a* may be formed to have a length shorter than the length or width of the inorganic light emitting device 300. That is, the nanowires 330*a* may be formed to have a length or width corresponding to that of the first electrode 120 of the inorganic light emitting device 300. Accordingly, the nanowires 330*a* are connected to each other in the fluorescent layer 330 and are arranged in random directions. That is, the nanowires 330*a* may form a random network in the fluorescent layer 330. Thus, the nanowires 330*a* may be relatively readily formed when compared to a case in which the nanowires 330*a* are formed with a length corresponding to the length or width of a unit pixel. Also, the fluorescent layer 330 may be formed by a random dispersion method since it is unnecessary for the nanowires 330*a* to be arranged in a predetermined direction due to their short length. Also, when the fluorescent layer 330 is formed by coating a nano-mixture of nanowires and an organic material, since the length of the nanowires 330*a* is relatively short, the fluorescent layer 330 may be formed by using a spin coating method, an ink-jet method, or a silk screen method. Also, the strength of the fluorescent layer 330 is increased by arranging the nanowires 330*a* to cross each other, although a pressure is applied to the fluorescent layer 330 in a direction perpendicular to the surfaces of the nanowires 330*a* and the first electrode 120, the bending of the inorganic light emitting device 300 may be prevented.

Also, a planarizing layer 335 that includes spaces formed between the nanowires 330*a* may be formed in the fluorescent layer 330.

An inorganic light emitting device 400 according to another embodiment of the present invention will now be described.

Figure 5:
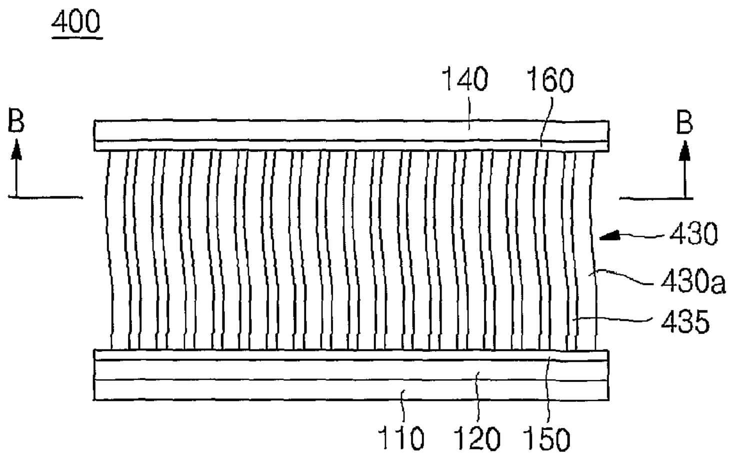
FIG. 5 is a schematic vertical cross-sectional view of an inorganic light emitting device according to another embodiment of the present invention.
Figure 6:
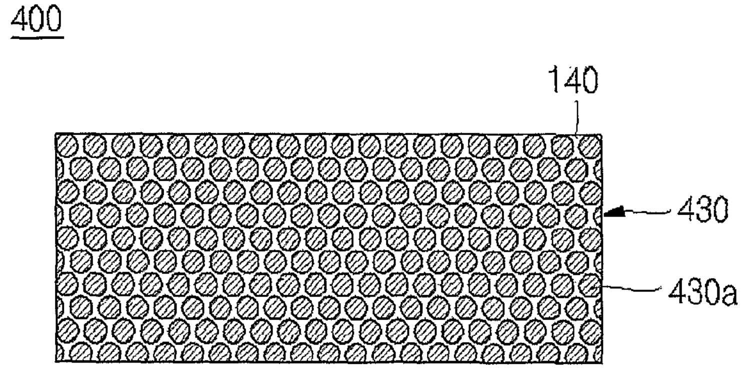
FIG. 6 is a schematic plan view taken along a line B-B of FIG. 5.

FIG. 5 is a schematic vertical cross-sectional view of the inorganic light emitting device 400 according to another embodiment of the present invention. FIG. 6 is a schematic plan view taken along a line B-B of FIG. 5.

Referring to FIGS. 5 and 6, the inorganic light emitting device 400 according to another embodiment of the present invention may include a first electrode 120, a fluorescent layer 430, and a second electrode 140. The inorganic light emitting device 400 may further include a substrate 110 formed on a lower surface of the first electrode 120, a first insulating layer 150 formed between the first electrode 120 and the fluorescent layer 430, and a second insulating layer 160 formed between the second electrode 140 and the fluorescent layer 430. Meanwhile, the inorganic light emitting device 400 may include one of the first insulating layer 150 and the second insulating layer 160 or both of them.

The inorganic fight emitting device 400 has a structure similar to the structure of the inorganic light emitting device 100 described with reference to FIGS. 1 and 2 in which the fluorescent layer 430 is rotated 90° in a vertical direction with respect to the upper surface of the first electrode 120. That is, the inorganic light emitting device 400 may have a structure in which the fluorescent layer 430 formed by nanowires 430*a* arranged in an upper direction of the first electrode 120 that is formed in a panel shape and the second electrode 140 are sequentially stacked.

Also, the inorganic light emitting device 400 according to another embodiment of the present invention has the same or similar structure as that of the inorganic light emitting device 100 described with reference to FIGS. 1 and 2 except for the structure of the fluorescent layer 430. Accordingly, hereinafter, the fluorescent layer 430 of the inorganic light emitting device 400 is mainly described. Also, like reference numerals are used to indicate elements that are substantially identical or similar to the elements of FIGS. 1 and 2, and thus the detailed description thereof will not be repeated.

The fluorescent layer 430 may be formed as a thin film by coating a plurality of nanowires 430*a* using a coating method. Also, the nanowires 430*a* may be formed of an inorganic light emitting material. The fluorescent layer 430 may have a thickness in a range from about 1 nm to about 10 μm. Also, the thickness of the fluorescent layer 430 may be controlled according to the density of the nanowires 430*a*.

The nanowires 430*a* may be formed having a length corresponding to a separated distance between the first electrode 120 and the second electrode 140. Meanwhile, when the inorganic light emitting device 400 includes the first insulating layer 150 and the second insulating layer 160, the nanowires 430*a* may be formed having a length corresponding to a separated distance between the first insulating layer 150 and the second insulating layer 160. The nanowires 430*a* may be disposed in a direction perpendicular to the upper surface of the first electrode 120. That is, the nanowires 430*a* may be disposed vertically from the first electrode 120 towards the second electrode 140. Also, the nanowires 430*a* may be disposed parallel to each other in a unit pixel. Also, the nanowires 430*a* may be arranged upwards of the first electrode 120 in across-logged shape.

Also, a planarizing layer 435 that fills spaces formed between the nanowires 430*a* may be formed in the fluorescent layer 430.

An inorganic light emitting device 500 according to another embodiment of the present invention will now be described.

Figure 7:
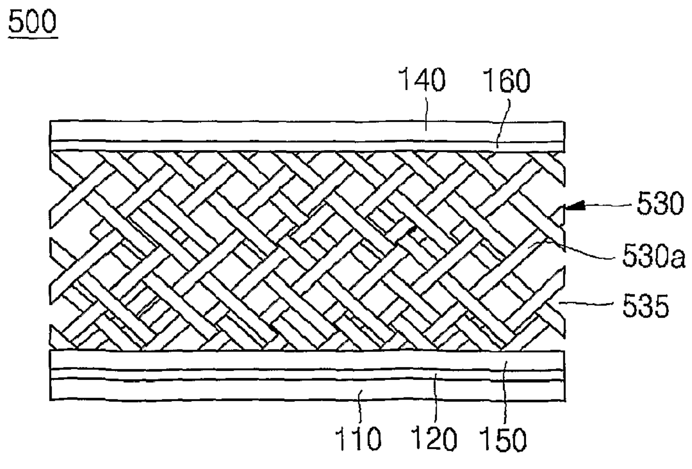
FIG. 7 is a schematic vertical cross-sectional view of an inorganic light emitting device corresponding to the schematic vertical cross-sectional view of the inorganic light emitting device of FIG. 5, according to another embodiment of the present invention.

FIG. 7 is a schematic vertical cross-sectional view, corresponds to FIG. 5, of the inorganic light emitting device 500 according to another embodiment of the present invention.

Referring to FIG. 7, the inorganic light emitting device 500 according to another embodiment of the present invention may include a first electrode 120, a fluorescent layer 530, and a second electrode 140. The inorganic light emitting device 400 may further include a substrate 110 formed on a lower surface of the first electrode 120, a first insulating layer 150 formed between the first electrode 120 and the fluorescent layer 530, and a second insulating layer 160 formed between the second electrode 140 and the fluorescent layer 530. Meanwhile, the inorganic light emitting device 500 may include one of the first insulating layer 150 and the second insulating layer 160 or both of them.

The inorganic light emitting device 500 has a structure similar to the structure of the inorganic light emitting device 400 described with reference to FIGS. 5 and 6 except for the structure of the fluorescent layer 530. Accordingly, hereinafter, the fluorescent layer 530 of the inorganic light emitting device 500 is mainly described. Also, like reference numerals are used to indicate elements of the inorganic light emitting device 500 that are substantially identical or similar to the elements of the inorganic light emitting device 400 of FIGS. 5 and 6, and thus the detailed description thereof will not be repeated.

The fluorescent layer 530 may be formed by coating a plurality of nanowires **530*a* using a coating method. Also, the nanowires 530*a*** may be formed of an inorganic light emitting material.

The nanowires **530*a* may be formed to have a length shorter than a separated distance between the first electrode 120 and the second electrode 140. Accordingly, the nanowires 530*a* are connected to each other in the fluorescent layer 530 and are arranged in random directions. That is, the nanowires 530*a* may form a random network in the fluorescent layer 530. Thus, the nanowires 530*a* may be relatively readily formed when compared to a case that the nanowires 530*a* are formed with a length corresponding to the separated distance between the first electrode 120 and the second electrode 140. Also, the fluorescent layer 530 may be formed by a random dispersion method since it is unnecessary for the nanowires 530*a* to be arranged in a predetermined direction due to their short length. Also, when the fluorescent layer 530 is formed by coating a nano-mixture of nanowires and an organic material, since the length of the nanowires 530*a* is relatively short, the fluorescent layer 530** may be formed by using a spin coating method, an ink-jet method, or a silk screen method.

Also, a planarizing layer 535 that fills spaces formed between the nanowires **530*a* may be formed in the fluorescent layer 530**.

An inorganic light emitting device 600 according to another embodiment of the present invention will now be described.

Figure 8:
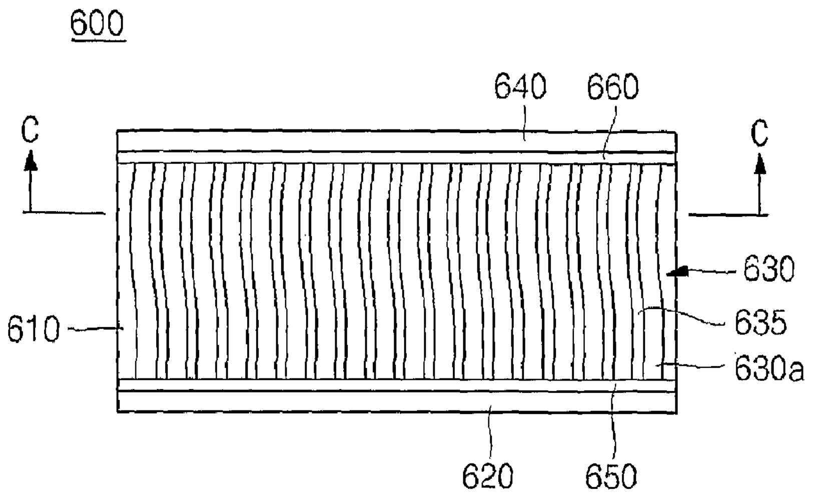
FIG. 8 is a schematic plan view of an inorganic light emitting device according to another embodiment of the present invention.
Figure 9:
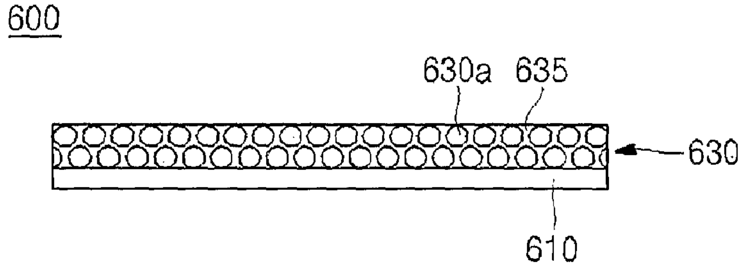
FIG. 9 is a schematic vertical cross-sectional view taken along line a C-C of FIG. 8.

FIG. 8 is a schematic plan view of the inorganic light emitting device 600 according to another embodiment of the present invention. FIG. 9 is a schematic vertical cross-sectional view taken along a line C-C of FIG. 8.

Referring to FIGS. 8 and 9, the inorganic light emitting device 600 according to another embodiment of the present invention may include an insulating substrate 610, a first electrode 620, a fluorescent layer 630, and a second electrode 640. Also, the inorganic light emitting device 600 may further include a first insulating layer 650 formed between the first electrode 620 and the fluorescent layer 630, and a second insulating layer 660 formed between the second electrode 640 and the fluorescent layer 630 according to the driving method of the inorganic light emitting device 600. The inorganic light emitting device 600 may include one of the first insulating layer 650 and the second insulating layer 660 or both of them.

In the inorganic light emitting device 600, the first electrode 620 and the second electrode 640 are separated from each other to form a barrier rib structure on the insulating substrate 610, and the fluorescent layer 630 is formed between the first and second electrodes 620 and 640. Accordingly, the inorganic light emitting device 600 has a structure similar to that of a discharge cell of a conventional plasma display panel (PDP).

The light emission efficiency of the inorganic light emitting device 600 can be increased since the first and second electrodes 620 and 640 are not necessarily formed of a transparent conductive material. Also, since the fluorescent layer 630 has a structure that directly emits light to the outside, the overall light emission efficiency of the inorganic light emitting device 600 is increased.

The insulating substrate 610 may be formed as the same or similar method as the substrate 110 described with reference to FIGS. 1 and 2, and thus the detailed description thereof will not be repeated.

The first electrode 620 may be formed in a bar shape, and disposed on a side of the insulating substrate 610 on the insulating substrate 610. At this point, the first electrode 620 may have a width smaller than the length thereof to increase an area of the fluorescent layer 630.

Since the first electrode 620 is not formed in a region where an image is displayed, the first electrode 620 may be a metal layer formed of a metal selected from the group consisting of Al, Al:Nd, Ag, Sn, W, Au, Cr, Mo, Pd, Pt, Ni, and Ti. Also, the first electrode 620 may be a transparent layer formed of a transparent conductive material selected from the group consisting of ITO, IZO, FTO, zinc oxide, Ca:ITO, and Ag:ITO.

The fluorescent layer 630 may be formed by coating nanowires **630*a* using a coating method between the first and second electrodes 620 and 640 on the insulating substrate 610. That is, the nanowires 630*a* may be formed to a length corresponding to a separated distance between the first and second electrodes 620 and 640. Accordingly, the nanowires 630*a* are electrically connected to the first and second electrodes 620 and 640. The fluorescent layer 630 may be formed as the same or similar method as the fluorescent layer 130 described with reference to FIGS. 1 and 2**, and thus the detailed description thereof win not be repeated.

Also, a planarizing layer 635 that includes spaces formed between the nanowires **630*a* may be formed in the fluorescent layer 630**.

The second electrode 640 may be formed in a bar shape and may be separated from the first electrode 620 on the other side of the insulating substrate 610 on the insulating substrate 610. The second electrode 640 is separated from the first electrode 620 to form a barrier rib for forming the fluorescent layer 630. Also the second electrode 640, like the first electrode 620, may have a width smaller than the length thereof to increase the area of the fluorescent layer 630. The second electrode 640 may be formed of the same or similar material used to form the first electrode 620, and thus the detailed description thereof will not be repeated.

The first insulating layer 650 may be formed between the first electrode 620 and the fluorescent layer 630 on the insulating substrate 610. The first insulating layer 650 may also be formed of the same or similar material used to form the first insulating layer 150 described with reference to FIGS. 1 and 2, and thus the detailed description thereof will not be repeated. However, unlike the first insulating layer 150 described with reference to FIGS. 1 and 2, the first insulating layer 650 may not necessarily be formed of a transparent material.

The second insulating layer 660 may be formed between the second electrode 640 and the fluorescent layer 630 on the insulating substrate 610. The second insulating layer 660 may be formed of the same or similar material used to form the first insulating layer 650. Also, the second insulating layer 660 may not necessarily be formed of a transparent material like the first insulating layer 650.

An inorganic light emitting device 700 according to another embodiment of the present invention will now be described.

Figure 10:
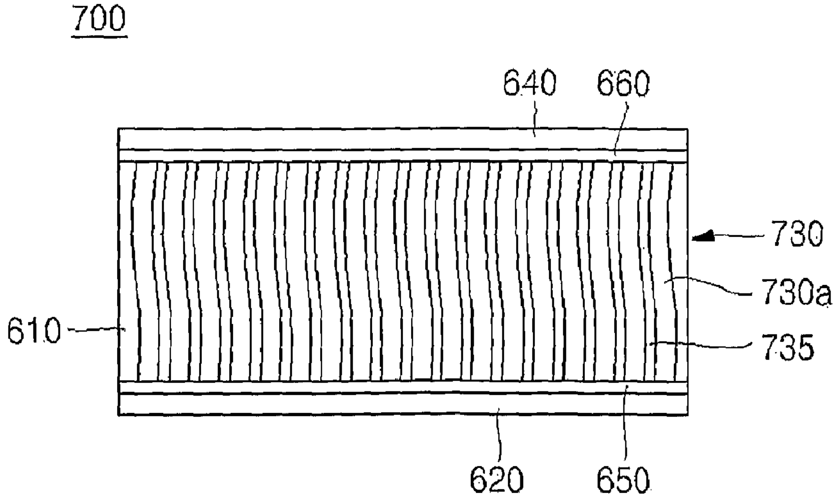
FIG. 10 is a schematic plan view of an inorganic light emitting device corresponding to the plan view of the inorganic light emitting device of FIG. 8, according to another embodiment of the present invention.

FIG. 10 is a schematic plan view of the inorganic light emitting device 700 corresponding to the inorganic light emitting device 600 of FIG. 8, according to another embodiment of the present invention.

Referring to FIG. 10, the inorganic light emitting device 700 according to another embodiment of the present invention may include an insulating substrate 610, a first electrode 620, a fluorescent layer 730, and a second electrode 640. Also, the inorganic light emitting device 700 may further include a first insulating layer 650 formed between the first electrode 620 and the fluorescent layer 730, and a second insulating layer 660 formed between the second electrode 640 and the fluorescent layer 730 on an upper surface of the insulating substrate 610. The inorganic light emitting device 700 may include one of the first insulating layer 650 and the second insulating layer 660 or both of them.

The inorganic light emitting device 700 according to another embodiment of the present invention has the same or similar structure as that of the inorganic light emitting device 600 described with reference to FIGS. 8 and 9 except for the structure of the fluorescent layer 730. Accordingly, hereinafter, the fluorescent layer 730 of the inorganic light emitting device 700 is mainly described. Also, like reference numerals are used to indicate elements of the inorganic light emitting device 700 that are substantially identical or similar to the elements of the inorganic light emitting device 600 of FIGS. 8 and 9, and thus the detailed description thereof will not be repeated.

The fluorescent layer 730 may be formed as a thin film by coating a plurality of nanowires 730*a* using a coating method. Also, the nanowires 730*a* may be formed of an inorganic light emitting material.

The fluorescent layer 730 may be formed as the same or similar method as the fluorescent layer 230 described with reference to FIG. 3. That is, the nanowires 730*a* may be formed to have a length corresponding to a separated distance between the first and second electrodes 620 and 640, and may be arranged in a direction parallel to an upper surface of the insulating substrate 610 in a cross-legged shape. The detailed description of the material of the fluorescent layer 730 is omitted.

Also, a planarizing layer 735 that fills spaces formed between the nanowires 730*a* may be formed in the fluorescent layer 730.

An inorganic light emitting device 800 according to another embodiment of the present invention will now be described.

Figure 11:
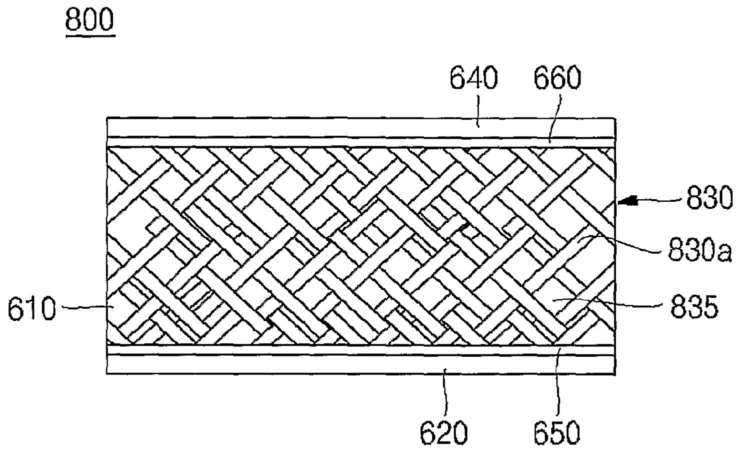
FIG. 11 is a schematic plan view of an inorganic light emitting device corresponding to the plan view of the inorganic light emitting device of FIG. 8, according to another embodiment of the present invention.

FIG. 11 is a schematic plan view of an inorganic light emitting device 800, corresponds to the plan view of the inorganic light emitting device 600 of FIG. 8, according to another embodiment of the present invention.

Referring to FIG. 11, the inorganic light emitting device 800 according to another embodiment of the present invention may include an insulating substrate 610, a first electrode 620, a fluorescent layer 830, and a second electrode 640. Also, the inorganic light emitting device 800 may further include a first insulating layer 650 formed between the first electrode 620 and the fluorescent layer 830, and a second insulating layer 660 formed between the second electrode 640 and the fluorescent layer 830 on an upper surface of the insulating substrate 610. The inorganic light emitting device 800 may include one of the first insulating layer 650 and the second insulating layer 660 or both of them.

The inorganic light emitting device 800 according to another embodiment of the present invention has the same or similar structure as that of the inorganic light emitting device 600 described with reference to FIGS. 8 and 9 except for the structure of the fluorescent layer 830. Accordingly, hereinafter, the fluorescent layer 830 of the inorganic light emitting device 800 is mainly described. Also, like reference numerals are used to indicate elements of the inorganic light emitting device 800 that are substantially identical or similar to the elements of the inorganic light emitting device 600 of FIGS. 8 and 9, and thus the detailed description thereof will not be repeated.

The fluorescent layer 830 may be formed as a thin film by coating a plurality of nanowires 830*a* using a coating method. Also, the nanowires 830*a* may be formed of an inorganic light emitting material.

The fluorescent layer 830 may be formed as the same or similar method as the fluorescent layer 330 described with reference to FIG. 4. That is, the nanowires 830*a* may be formed to have a length smaller than the length or width of a unit pixel that constitutes the inorganic light emitting device 800. That is, the nanowires 830*a* may be formed to have a length smaller than a separated distance between the first and second electrodes 620 and 640. Accordingly, the nanowires 830*a* may form a random network in the fluorescent layer 830. The detailed description of the fluorescent layer 830 is omitted.

Also, a planarizing layer 835 that fills spaces formed between the nanowires 830*a* may be formed in the fluorescent layer 830.

Next, an inorganic light emitting device according to an embodiment will now be more specifically described.

First, a fluorescent layer of an inorganic light emitting device according to an embodiment of the present invention is described.

Figure 12:
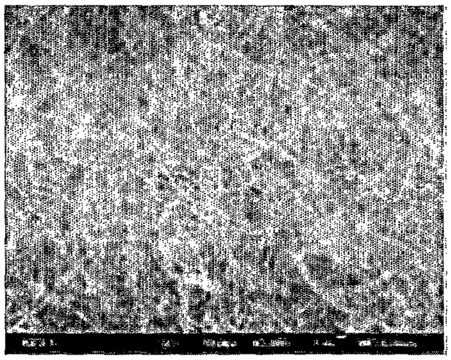
FIG. 12 is a scanning electron microscope (SEM) image of a fluorescent layer of an inorganic light emitting device according to an embodiment of the present invention.
Figure 13:
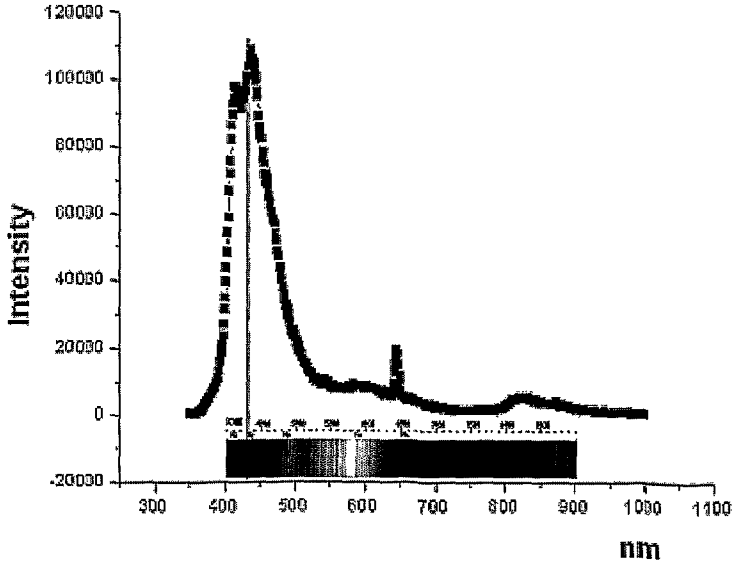
FIG. 13 is a photo luminescence (PL) pattern of the fluorescent layer of FIG. 12.
Figure 14:
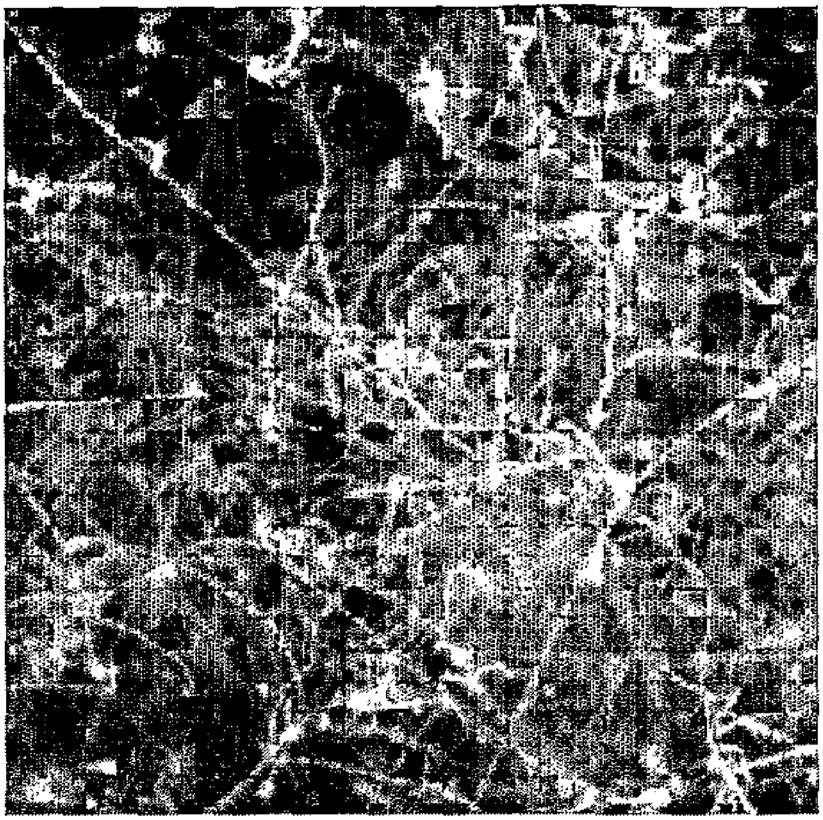
FIG. 14 is a cathode luminescence (CL) image of the fluorescent layer of FIG. 12.

FIG. 12 is a scanning electron microscope (SEM) image of a fluorescent layer of an inorganic light emitting device according to an embodiment of the present invention. FIG. 13 is a photo luminescence (PL) pattern of the fluorescent layer of FIG. 12. FIG. 14 is a cathode luminescence (CL) image of the fluorescent layer of FIG. 12.

The fluorescent layer of the inorganic light emitting device according to an embodiment of the present invention was formed by coating a nano-mixture made by mixing nanowires formed of a fluorescent substance of ZnS:Te and an organic material on a surface of a substrate. At this point, the fluorescent layer was formed to have the structure of the fluorescent layer of the inorganic light emitting device of FIG. 4. Also, referring to FIG. 12, it is seen in the fluorescent layer that a plurality of nanowires are randomly arranged and form a network. Also, referring to the PL pattern of FIG. 13, a peak is observed in a blue color region, that is, in a wavelength of about 450 nm region. Also, referring to the CL image of FIG. 14, it is observed that a blue color image is formed. Accordingly, it denotes that the above fluorescent layer is a blue color fluorescent layer.

Next, a fluorescent layer of an inorganic light emitting device according to another embodiment will now be described.

Figure 15:
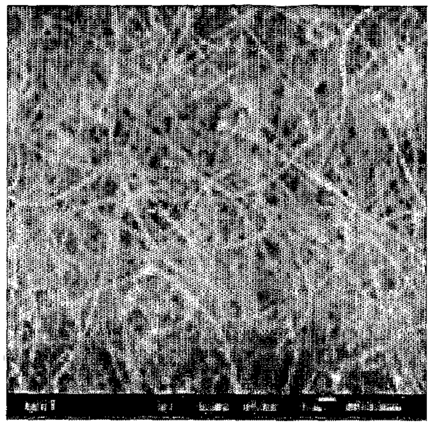
FIG. 15 is an SEM image of a fluorescent layer of an inorganic light emitting device according to another embodiment of the present invention.
Figure 16:
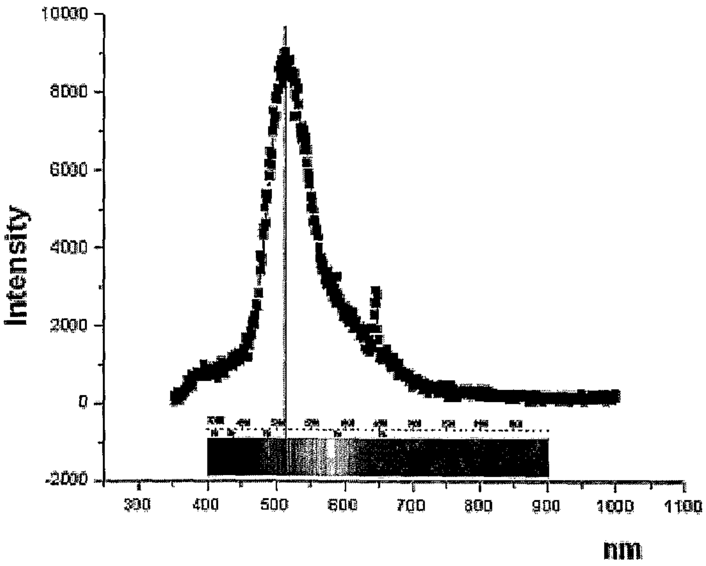
FIG. 16 is a PL pattern of the fluorescent layer FIG. 15.
Figure 17:
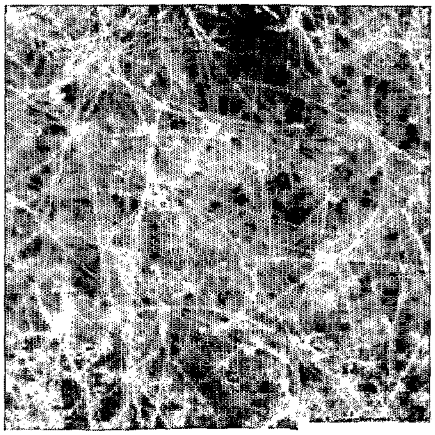
FIG. 17 is a CL image of the fluorescent layer of FIG. 15.

FIG. 15 is a scanning electron microscope (SEM) image of a fluorescent layer of an inorganic light emitting device according to another embodiment of the present invention. FIG. 16 is a PL pattern of the fluorescent layer FIG. 15. FIG. 17 is a CL image of the fluorescent layer of FIG. 15.

The fluorescent layer of the inorganic light emitting device according to another embodiment of the present invention was formed by coating a nano-mixture made by mixing nanowires formed of a fluorescent substance of ZnS:Eu and an organic material on a surface of a substrate. At this point, the fluorescent layer was formed to have the structure of the fluorescent layer of the inorganic light emitting device of FIG. 4. Also, referring to FIG. 15, it is seen in the fluorescent layer that a plurality of nanowires are randomly arranged and form a network. Also, referring to the PL pattern of FIG. 16, a peak is observed in a green color region, that is, in a wavelength of about 500 nm region. Also, referring to the CL image of FIG. 17, it is observed that a green color image is formed. Accordingly, it denotes that the above fluorescent layer is a green color fluorescent layer.

Next, a flat panel display apparatus that uses an inorganic light emitting device according to an embodiment of the present invention will now be briefly described.

Figure 18:
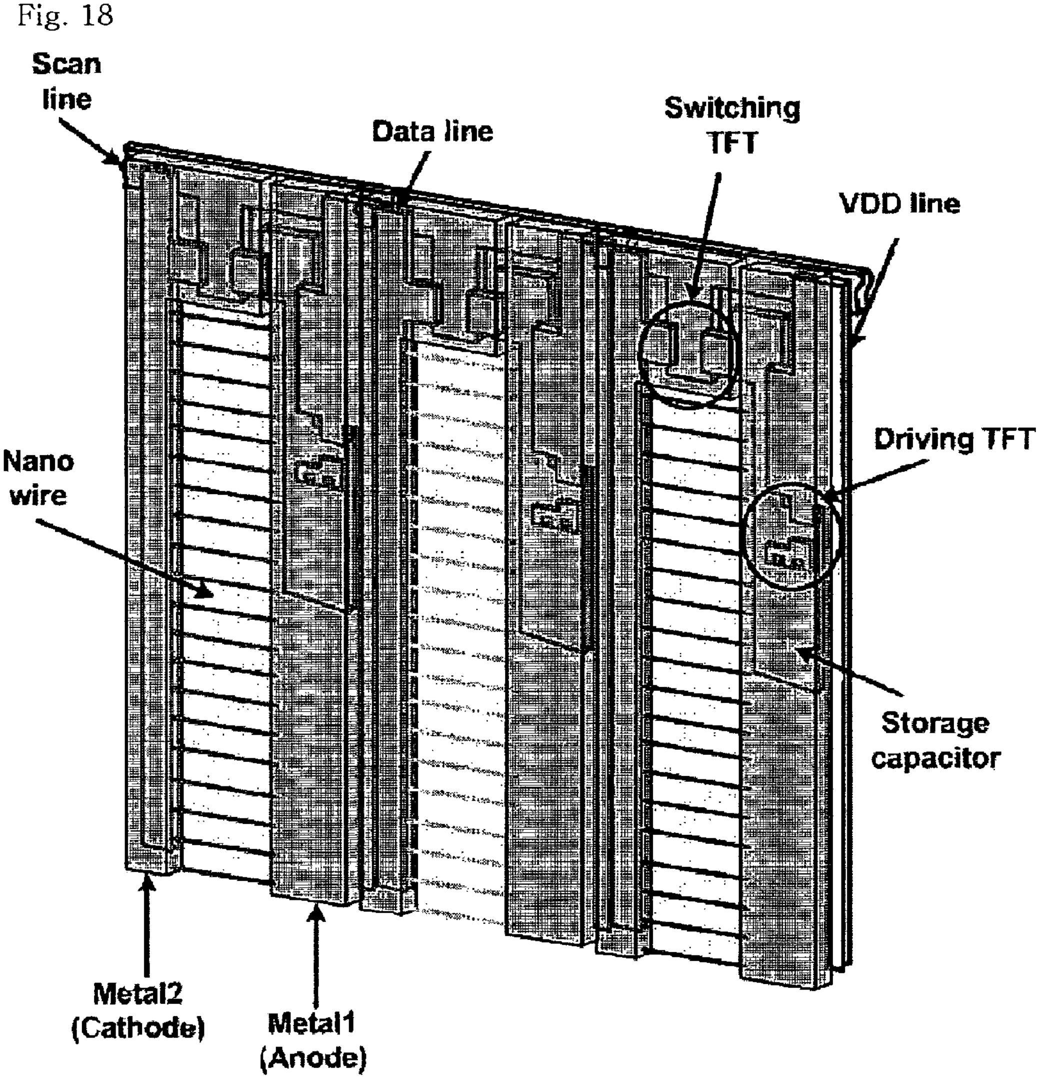
FIG. 18 is a perspective view of a structure of a unit pixel of a flat panel display apparatus that uses an inorganic light emitting device according to an embodiment of the present invention.

FIG. 18 is a perspective view of a structure of a unit pixel of a flat panel display apparatus that uses an inorganic light emitting device according to an embodiment of the present invention.

Referring to FIG. 18, the flat panel display apparatus that uses an inorganic light emitting device according to an embodiment of the present invention includes three inorganic light emitting devices that respectively emit red, green, and blue light form a unit pixel. Also, the flat panel display apparatus includes a cathode electrode as a first electrode and an anode electrode as a second electrode on an upper surface of a substrate, and a fluorescent layer formed of nanowires between the cathode electrode and the anode electrode. Also, the flat panel display apparatus includes a scan line, a data line, and a VDD line formed under the cathode electrode and the anode electrode. Also, the flat panel display apparatus includes a switching thin film transistor (TFT) and a driving TFT that are electrically connected to the scan line, the data line, and the VDD line. The flat panel display apparatus includes various lines and TFTs as described above, and the electrical connection between the elements can be determined according to the driving method. Also, the lines and the TFTs of the flat panel display apparatus can be formed as the same way as an OLED.

The cathode electrode and the anode electrode extend in a direction of a substrate, and are separated from each other in a direction perpendicular to the extension direction thereof. The fluorescent layer can be formed by arranging a plurality of nanowires in a direction parallel to the separated direction between the cathode electrode and the anode electrode. Accordingly, when a voltage is applied between the cathode electrode and the anode electrode, the fluorescent layer realizes red, green, or blue color according to the fluorescent substance that constitutes the nanowires.

Although not shown, the flat panel display apparatus can be a unit pixel by using the various types of inorganic light emitting devices described above.

What is claimed is:

1. An inorganic light emitting device comprising:
- a first electrode;
- a fluorescent layer formed above the first electrode and comprises a plurality of nanowires formed of an inorganic light emitting material; and
- a second electrode formed above the fluorescent layer, wherein the fluorescent layer is formed by coating the nanowires and the nanowires are arranged in a horizontal direction with respect to an upper surface of the first electrode.

2. The inorganic light emitting device of claim 1, wherein the fluorescent layer is formed by coating a polar solvent in which the nanowires are dispersed using a field effect dispersion method, a random dispersion method, or an alignment method, in which an electric field is applied to the polar solvent after dropping the polar solvent.

3. The inorganic light emitting device of claim 1, wherein the fluorescent layer is formed by coating a nano-mixture made by mixing the nanowires and an organic material.

4. The inorganic light emitting device of claim 3, wherein the nano-mixture is coated by using a method selected from the group consisting of a spin coating method, an ink-jet method, laser transfer method, a nano-implantation method, and a silk screen printing method.

5. The inorganic light emitting device of claim 3, wherein the organic material is removed in a subsequent heating process after being coated.

6. The inorganic light emitting device of claim 3, wherein the organic material comprises one selected from the group consisting of a conductive polymer resin, a silicon resin, a polyimide resin, an urea resin, and an acryl resin, an optically transparent epoxy resin, and an optically transparent silicon resin.

7. The inorganic light emitting device of claim 3, wherein the organic material further comprises a light emission activator or a nanowire dispersant.

8. The inorganic light emitting device of claim 1, in which the inorganic light emitting material that is used as:
- a red fluorescent substance comprises one material selected from the group consisting of CaS:Eu(host: dopant) ZnS:Sm, ZnS:Mn, $Y_2O_2S$:Eu, $Y_2O_2S$:Eu,Bi, $Gd_2O_3$:Eu, (Sr,Ca,Ba,Mg)$P_2O_{27}$:Eu, Mn, $CaLa_2S_4$:Ce, $SrY_2S_4$:Eu, (Ca,Sr)S:Eu, SrS:Eu, $Y_2O_3$:Eu, and $YVO_4$: Eu, B,
- a green fluorescent substance comprises one material selected from the group consisting of Zns:Tb(Host: dopant), ZnS:Ce,Cl, ZnS:Eu, ZnS:Cu,Al, $Gd_2O_2S$:Tb, $Gd_2O_3$:Tb,Zn, $Y_2O_3$:Tb,Zn, $SrGa_2S_4$:Eu, $Y_2SiO_5$:Tb, $Y_2Si_2O_7$:Tb, $Y_2O_2S$:Tb, ZnO:Ag, ZnO:Cu,Ga, CdS: Mn, $BaMgAl_{10}O_{17}$:Eu,Mn, (Sr,Ca,Ba)$(Al,Ga)_2S_4$:Eu, $Ca_8Mg(SiO_4)4Cl_2$:Eu,Mn, $YBO_3$:Ce,Tb, $Ba_2SiO_4$:Eu, $(Ba,Sr)_2SiO_4$:Eu, $Ba_2(Mg,Zn)Si_2O_7$:Eu, (Ba,Sr)$Al_2O_4$: Eu, and $Sr_2Si_3O_8.2SrCl_2$:Eu, and
- a blue fluorescent substance comprises one material selected from the group consisting of GaN:Mg,Si(Host: dopant), Gan:Zn,Si, SrS:Ce, SrS:Cu, ZnS:Tm, ZnS:Ag, Cl, ZnS:Te, $Zn_2SiO_4$:Mn, $YSiO_5$:Ce, $(Sr,Mg,Ca)_{10}$ $(PO_4)6Cl_2$:Eu, $BaMgAl_{10}O_{17}$:Eu, $BaMg_2Al_{16}O_{27}$:Eu.

9. The inorganic light emitting device of claim 1, wherein the nanowires are formed to have a length smaller than a distance between the first electrode and the second arranged and connected to each other in the fluorescent layer.

10. The inorganic light emitting device of claim 1, further comprises at least one of a first insulating layer formed between the first electrode and the fluorescent layer and a second insulating layer formed between the second electrode and the fluorescent layer, wherein the first and second isulating layers are formed of an organic material, a inorganic material, or a composite of the organic and inorganic materials.

11. An inorganic light emitting device comprising:

an insulating substrate;

a first electrode formed in a bar shape on a side of an upper surface of the insulating substrate;

a second electrode separated from the first electrode on the other side of the upper surface of the insulating substrate; and a fluorescent layer formed between the first electrode and the second electrode and comprises a plurality of nanowires formed of an inorganic light emitting material, wherein the fluorescent layer is formed by coating the nanowires.

12. The inorganic light emitting device of claim 11, wherein the fluorescent layer is formed by coating a polar solvent in which the nanowires are dispersed using a field effect dispersion method, a random dispersion method, or an alignment method, in which an electric field is applied to the polar solvent after dropping the polar solvent.

13. The inorganic light emitting device of claim 11, wherein the fluorescent layer is formed by coating a nano-mixture made by mixing the nanowires and an organic material.

14. The inorganic light emitting device of claim 13, wherein the nano-mixture coated by using a method selected from the group consisting of a spin coating method, an ink-jet method, a laser transfer method, a nano-implantation method, and a silk screen printing method.

15. The inorganic light emitting device of claim 13, wherein the organic material is removed in a subsequent heating process after being coated.

16. The inorganic light emitting device of claim 13, wherein the organic material comprises one selected from the group consisting of a conductive polymer resin, a silicon resin, a polyimide resin, an urea resin, and an acryl resin, an optically transparent epoxy resin, and an optically transparent silicon resin.

17. The inorganic light emitting device of claim 13, wherein the organic material further comprises a light emission activator or a nanowire dispersant.

18. The inorganic light emitting device of claim 11, wherein the nanowires are arranged in a horizontal direction or a vertical direction with respect to an upper surface of the first electrode, or in irregular directions between the first electrode and the second electrode.

19. The inorganic light emitting device of claim 11, wherein the nanowires are formed to have a length smaller than a distance between the first electrode and the second electrode, and form a random network by being randomly arranged and connected to each other in the fluorescent layer.

20. The inorganic light emitting device of claim 11, further comprises at least one of a first insulating layer formed between the first electrode and the fluorescent layer and a second insulating layer formed between the second electrode and the fluorescent layer, wherein the first and second insulating layers are formed of an organic material, an inorganic material, or a composite of the organic and inorganic materials.

* * * * *